United States Patent [19]
MacCracken et al.

[11] Patent Number: 5,632,919
[45] Date of Patent: May 27, 1997

[54] TEMPERATURE CONTROLLED INSULATION SYSTEM

[75] Inventors: Thomas G. MacCracken; Janet MacCracken, both of Van Alstyne; Richard E. MacCracken, Dallas; Millard B. Rice, Plano, all of Tex.

[73] Assignee: T.G.M., Inc., Gunter, Tex.

[21] Appl. No.: 591,356

[22] Filed: Jan. 25, 1996

[51] Int. Cl.$^6$ .................. H05B 3/58; H05B 1/02
[52] U.S. Cl. .................. 219/494; 219/529; 219/535; 219/531; 219/549; 138/33
[58] Field of Search .................. 219/482–483, 219/494, 510, 528–529, 531, 535, 542, 548, 549; 340/501, 584, 586; 138/33

[56] References Cited

U.S. PATENT DOCUMENTS

| | | | |
|---|---|---|---|
| 2,617,916 | 11/1952 | Neidig | 219/528 |
| 3,806,702 | 4/1974 | Spencer | 219/528 |
| 4,042,803 | 8/1977 | Bickford | 219/211 |
| 4,245,149 | 1/1981 | Fairlie | 219/528 |
| 4,736,088 | 4/1988 | Bart | 219/211 |
| 4,810,859 | 3/1989 | Anabtawi et al. | 219/535 |
| 4,833,299 | 5/1989 | Estes | 219/535 |
| 5,197,595 | 3/1993 | Coultas | 219/535 |
| 5,306,897 | 4/1994 | Fraser | 219/535 |
| 5,517,593 | 5/1996 | Nenniger et al. | 219/494 |

OTHER PUBLICATIONS

"Custom Cloth Heating & Insulating Products", Briskheat Corporation, Literature No. 10838–04, Sep. 1990.
"Silicone Rubber Heating Products" Briskheat Corporation Literature No. 10617–01 Sep. 1990.
"Temperature Controllers" Briskheat Corporation, Literature No. 10631, Sep. 1990.
"Full Coverage Insulated Drum Heater" Briskheat Corporation, Form 10838–05, 1991.
"Heated Pumping Lines" HPS Division, MKS Instruments, Inc. Apr. 1994.

*Primary Examiner*—Teresa J. Walberg
*Assistant Examiner*—Raphael Valencia
*Attorney, Agent, or Firm*—Martin Korn

[57] ABSTRACT

A insulation system for providing temperature control of a surface includes a flexible heating element, conformable to the surface. Insulating material is disposed adjacent to the heating element. Circuitry is provided for sensing the temperature of the surface. A monitor senses the temperature of the surface and selectively controls the temperature of the heating element in response to the monitoring process.

5 Claims, 4 Drawing Sheets

TEMPERATURE CONTROLLED INSULATION SYSTEM

TECHNICAL FIELD OF THE INVENTION

The present invention relates to insulation devices, and more particularly to a temperature controlled pre-insulated removable heater and system.

BACKGROUND OF THE INVENTION

In mechanical processing systems, the temperature of gases and fluids can be critical to the manufacturing process. For example, in vapor deposition, aluminum etching, and other semiconductor processes, reaction by-products are generated in the effluent gas that builds up on cool surfaces. This solid build-up reduces vacuum conductance and can render components inoperative. This solid build-up can also flake apart and become a source of contamination within the manufacturing process. By delivering gases at the proper temperature, condensation and solid particulate build-up in the piping systems can be minimized. As a result, higher yields of production can be created. Additionally, a reduction of solid build-up in gas delivery systems results in longer intervals between maintenance to increase production uptime. In manufacturing systems where vacuum exhaust lines are utilized, the build up of solid particulate on the interior walls of the piping has presented a constant problem. Due to backdraft effect caused by normal pump cycling, this particle build-up can lead to product contamination, as well as pump failure.

Systems that have been proposed to deliver gases at a proper temperature include the use of electrical heat tape and conventional pipe insulation. However, such systems have yielded non-uniform heating of the piping system, cold spots, and over compensation for heating due to non-uniform heat control.

A need has thus arisen for a temperature controlled insulation system for the accurate control of temperature on a surface. Such a temperature controlled system will result in increased yield in manufacturing processes with the addition of equipment protection to avoid costly shutdown.

A need has further arisen for a heated and insulated as well as removable and reusable insulation system that is economical to use and easily fitted to existing configurations of piping systems.

SUMMARY OF THE INVENTION

In accordance with the present invention, an insulation system for providing temperature control of a surface is provided. The system includes a flexible heating element, conformable to the shape of the surface. Insulating material is disposed adjacent to the heating element. Circuitry is provided for sensing the temperature of the surface. A monitor senses the temperature of the surface and selectively controls the temperature of the heating element in response to the monitoring process.

In accordance with another aspect of the present invention, an insulation system for providing temperature control of a surface is provided. The system includes a flexible heating element, conformable to the shape of the surface. A first layer of insulating material is provided and is disposed adjacent to the heating element. A second layer of insulating material is disposed adjacent to the first layer of insulating material. An external layer of insulating material is disposed adjacent to the second layer of insulating material. Circuitry is provided adjacent to the flexible heating element for sensing the temperature of the surface. A monitor is provided for monitoring the temperature of the surface and for selectively controlling the temperature of the heating element.

BRIEF DESCRIPTION OF THE DRAWINGS

For a more complete understanding of the present invention and for further advantages thereof, reference is now made to the following Description of the Preferred Embodiments taken in conjunction with the accompanying Drawings in which.

DESCRIPTION OF THE PREFERRED EMBODIMENTS

Figure 1:
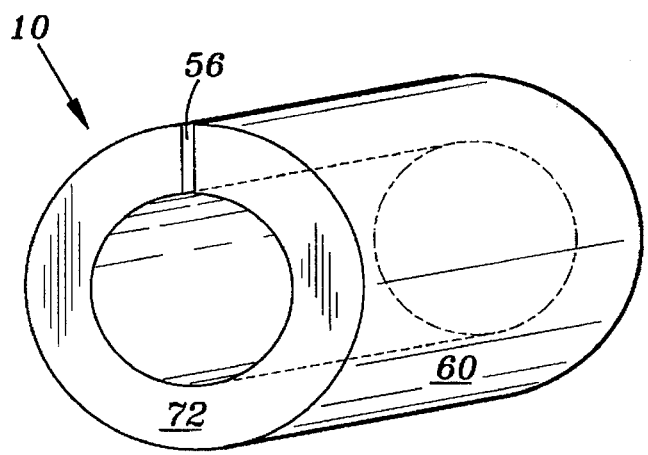
FIG. 1 is a perspective view of the present heating element for use in the present insulation system.
Figure 2:
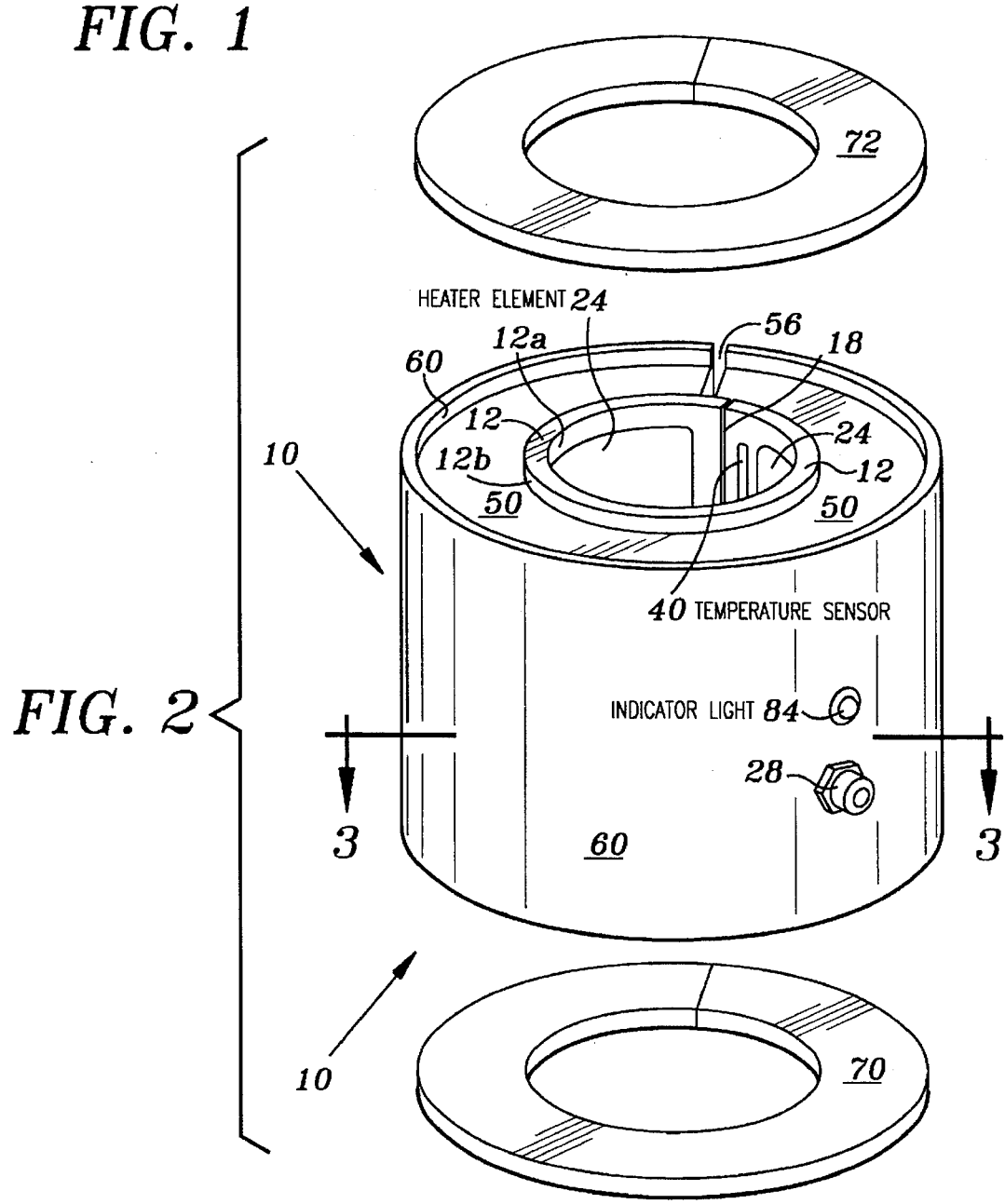
FIG. 2 is an enlarged, perspective view of the present heating element, partially exploded.
Figure 3:
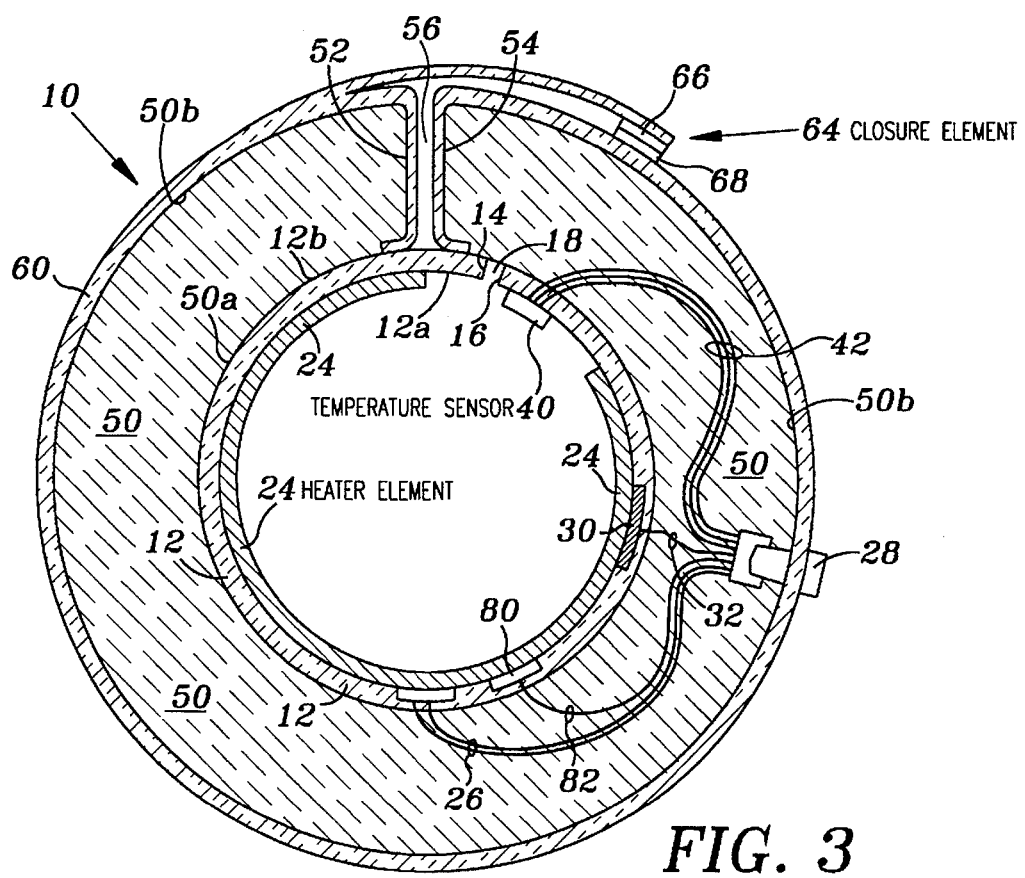
FIG. 3 is a sectional view taken generally along sectional lines 3—3 of FIG. 2 illustrating the present heating element.
Figure 4:
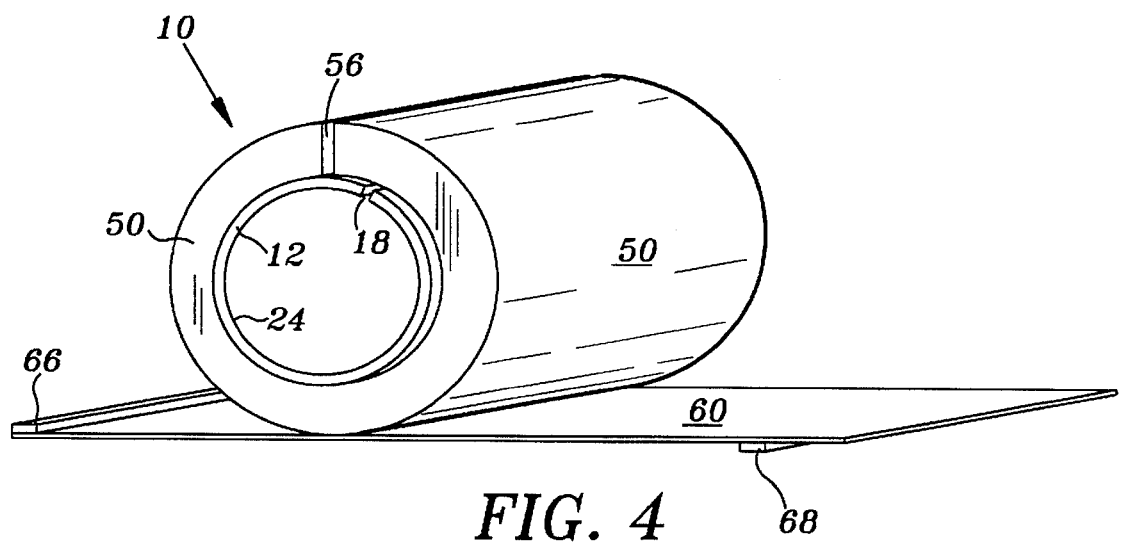
FIG. 4 is a perspective view illustrating one aspect of the assembly of the external layer of insulating material for the present heating element.

Referring simultaneously to FIGS. 1–4, the present heater, generally identified by the numeral 10, for use in the present insulation system is illustrated. Heater 10 is illustrated in a generally cylindrical configuration in FIGS. 1–4 for use in insulating a cylindrical surface, such as, for example, a pipe in a manufacturing process. The pipe may transport gases or other chemicals for use in a manufacturing process. Although FIGS. 1–4 illustrate heater 10 in a cylindrical configuration, the present invention is not limited to such a configuration, and heater 10 may be configured in a variety of shapes to conform to surfaces to be insulated and heated, the cylindrical configuration being shown in FIGS. 1–4 for illustrative purposes only.

Heater 10 includes a first layer of insulation 12 having an interior surface 12a and an exterior surface 12b. Insulation 12 may comprise, for example, silicone foam, and have a thickness of, for example, one quarter inch. Insulation 12 includes ends 14 and 16 which lie adjacent each other and form a longitudinal seam or gap 18 which extends along the surface being heated.

Disposed adjacent interior surface 12a of insulation 12 is a foil etched silicone rubber insulated heating element 24 which is flexible to conform to the surface to be heated. Heating element 24 may be constructed of a reinforced silicone rubber mat with a silicone foam insulation vulcanized or cast onto the heater mat. The silicone foam insulation is used to reduce component heat loss and also reduce heater outer surface temperature. Attached to heater element 24 are electrical leads 26 which are connected to a connector 28. A grounding strap 30 is connected to heater element 24 via an electrical lead 32. Lead 32 is also connected to connector 28.

Also disposed on interior surface 12a of insulation 12 is a temperature sensor 40. Temperature sensor 40 extends along the entire length of heater 10 and may comprise, for example, a thermistor, thermal couple, or RTD thermal sensor ribbon for monitoring the temperature of the surface to be heated. Attached to sensor 40 are leads 42 which are also interconnected to connector 28.

Attached to exterior surface 12b of insulation layer 12 is a second insulation layer 50 having an interior surface 50a and an exterior surface 50b. Insulation layer 50 may comprise, for example, Fiberglas, ceramic fiber, ceramic felt, or mineral wool, and have a thickness of, for example, one-half inch to one inch. Insulation layer 50 includes ends which are disposed in an abutting relationship to form a longitudinal seam or gap 56 which extends along the surface to be heated. Gap 56 is circumferentially spaced apart from gap 18 of insulation layer 12 to prevent heat loss from the surface to be heated through heater 10. Insulation layer 50 may be cemented to insulation layer 12 along their adjoining surfaces 50a and 12b utilizing room temperature vulcanizing cement. However, no cement is placed adjacent to ends 52 and 54 in order to allow insulation layers 50 and 12 to be separated for installation to the surface to be heated and rejoined to surround the surface, such as a pipe.

Surrounding surface 50b of insulation layer 50 is an external insulation layer 60 of insulating material such as, for example, high temperature silicone impregnated Fiberglas cloth which is cemented to surface 50b of insulation layer 50. As more clearly illustrated in FIGS. 3 and 4, layer 60 contacts and surrounds ends 52 and 54 of layer 50 to seal exposed ends 52 and 54 of layer 50. Layer 60 closes gap 56 in layer 50 utilizing a closure element 64. Closure element 64 may comprise, for example, a strip of Velcro loop material 66 which mates with a strip of Velcro hook material 68 disposed on the opposite surfaces of insulation layer 60. Closure element 64 extends from a flap of material attached to exterior layer 60. Additionally, a mechanical closure arrangement may be utilized for selectively locking together ends 52 and 54 of insulation 50 when heater 10 is positioned on the surface. Closure member 64 may additionally comprise, for example, a mechanical arrangement of male and female pins inserted in the ends 52 and 54 of insulation layer 50.

Heater 10 further includes end caps 70 and 72 (FIG. 2) which are cemented to insulation layer 50 and 12 to provide for additional insulation of heater 10. Heater 10 further includes a fuse element 80 disposed adjacent to heating element 24. Fuse element 80 includes leads 82 which extend through insulation layer 50 to connector 28. Heater 10 further includes an indicator light 84 (FIG. 2) indicating, when illuminated, that power is being supplied to heating element 24.

It therefore can be seen that heater 10 includes two layers of insulation, 12 and 50 having offset longitudinal seams in order to insulate the surface being heated by heating element 24. Additionally, heater 10 includes an external insulation layer for sealing longitudinal seam 56 with a reclosable latch mechanism for easy installation of heater 10 to the surface to be heated. The present heater 10 provides for uniform heating of the surface, eliminating cold spots throughout the surface due to the configuration of insulation layers 12, 50, and 60 (FIGS. 1-4).

Figure 5:
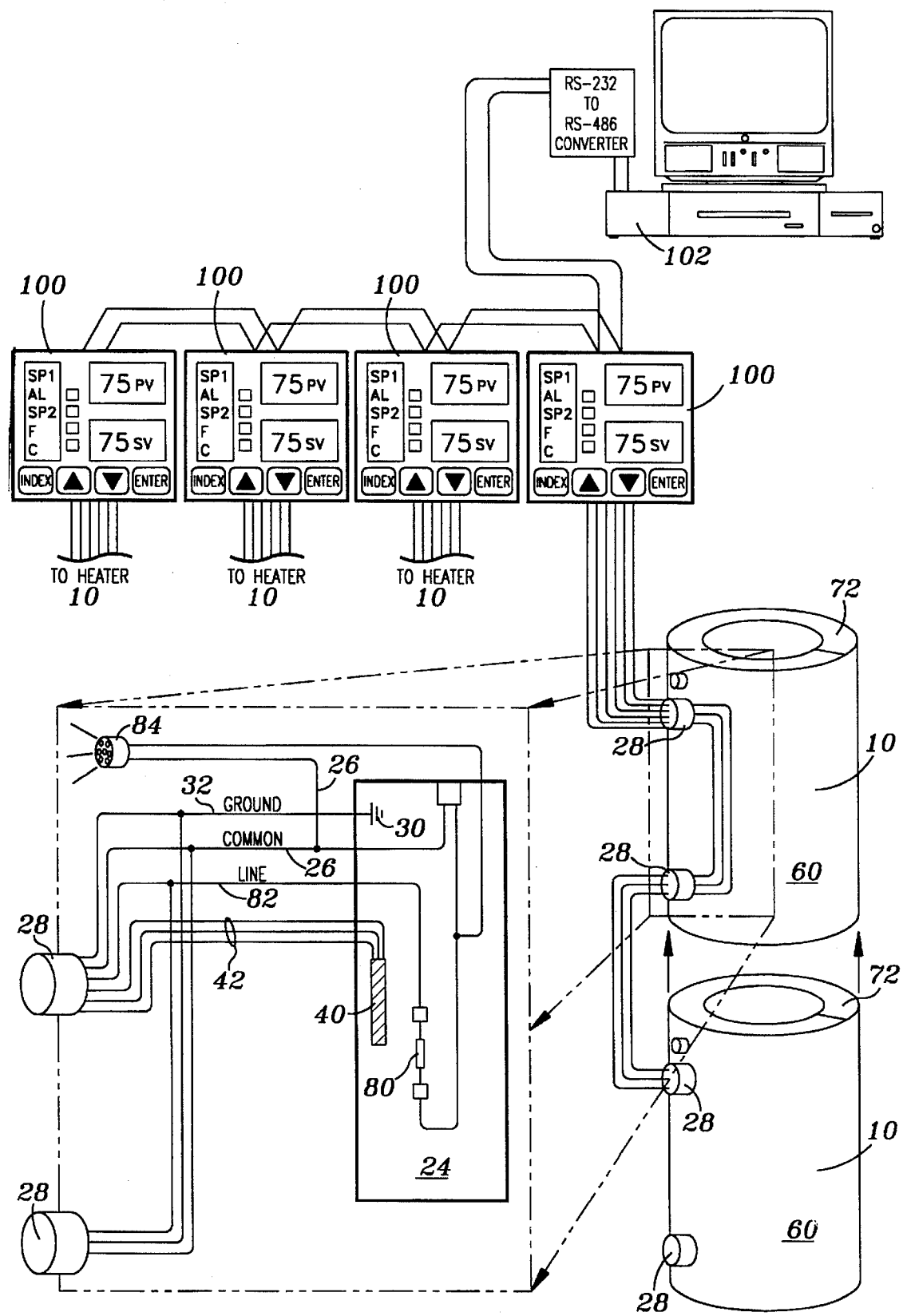
FIG. 5 is a schematic diagram of the present heating element and temperature monitoring system.

Referring now to FIG. 5, an electrical schematic diagram of the present system is illustrated wherein like numerals are utilized for like and corresponding components previously identified. Heater 10 is interconnected to a controller 100. Controller 100 may comprise, for example, a Model No. CT-16 manufactured and sold by MINCO. Controller 100 is interconnected to a computer 102 via a communications link such as, for example, a half duplex RS-485. Multiple controllers 100 may be connected in a "daisy-chain" fashion to computer 102 such that multiple heaters 10 may be interconnected and monitored in a continuous fashion. Computer 102 provides for a display of user input temperature variables as well as real-time temperature conditions of the surface to be monitored.

Controller 100 provides temperature control signals to heating element 24 and monitors actual temperatures sensed via sensor 40. Set variables (SV) and process variables (PV) are selected by the user of the present system through controller 100 and computer 102.

Figure 6:
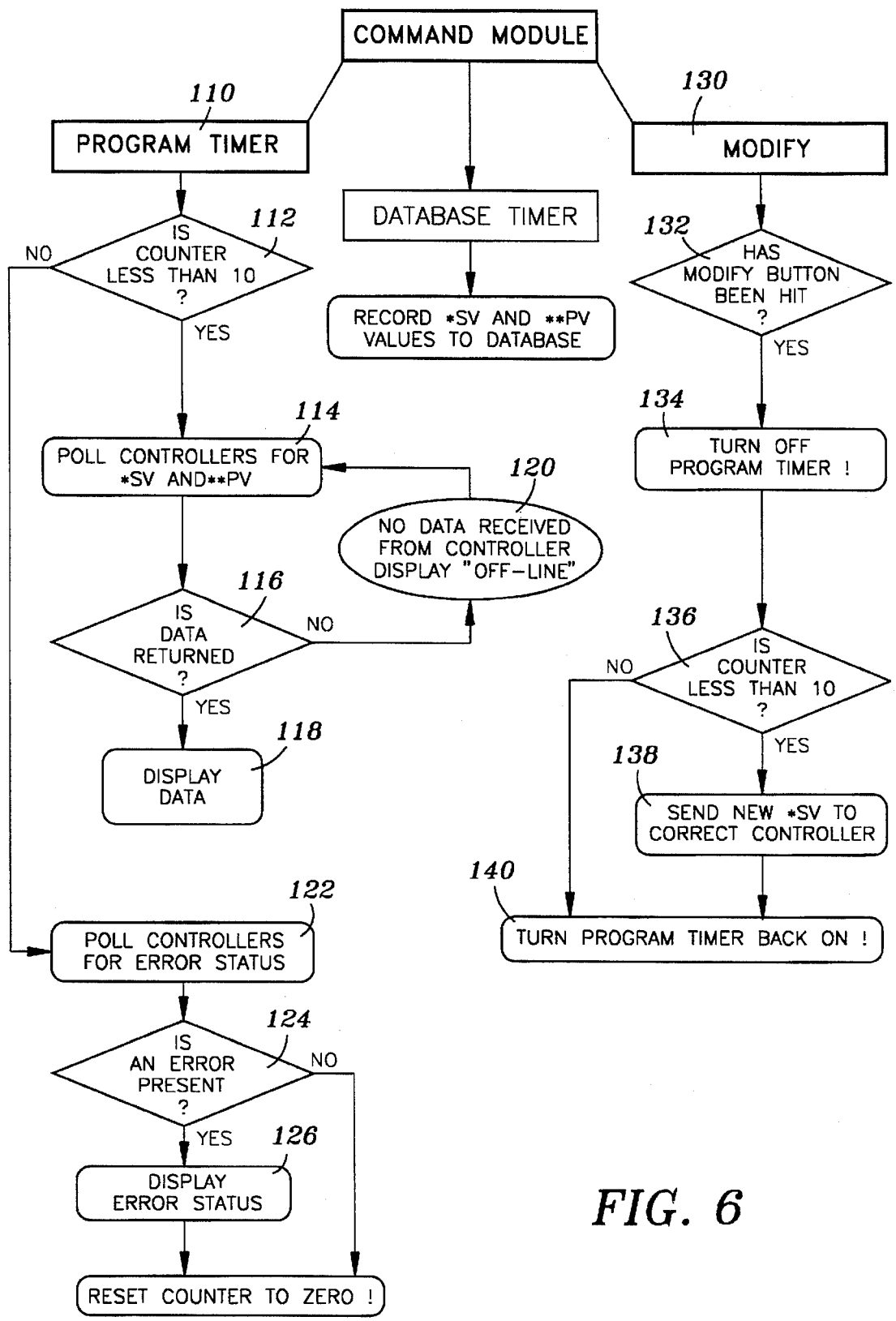
FIG. 6 is a computer flow diagram of the present temperature monitoring system.

FIG. 6 illustrates a computer flow diagram illustrating the process for establishing and monitoring variables in the present system. A command module program resident in computer 102 controls a program timer and modifying program. The program timer 110 determines if a count has exceeded 10 at decision block 112. If the count is less than 10, the system polls controller 100 for the values of set variable and process variable at block 114. If the data is returned at decision block 116, data is displayed on computer 102 at block 118. If no data is returned, the flow returns to block 114 and the display "off-line" is displayed at block 120. If the timer is greater than 10, at decision block 112, the controllers are polled for an error status at block 122. If an error is present, decided at block 124, computer 102 displays an error status at block 126. If no error is present, the counter is reset to zero.

In order to modify system variables, at block 130, a decision is made at block 132 to determine if a modify button on controller 100 has been actuated. If the modify button has been actuated, the program timer is turned off at block 134. If the counter is less than 10, determined at block 136, a new set variable parameter is set to controller 100 at block 138. If the counter is greater than 10, the program timer is turned back on at block 140.

The present system allows the for continuous monitoring in real-time of the temperatures of the surface to be heated to provide immediate compensation for fluctuations in the temperature of the surface to thereby maintain uniformity in heating of the surface. This immediate, real-time monitoring in addition to the use of the present heater 10 results in less power consumption to maintain the surface at a predetermined temperature than required by previously developed insulation systems.

It therefore can be seen that the present insulation system provides for a system that generates uniform heat over a surface with exact temperature selection and monitoring utilizing a heater which is easily installable, removable, and reusable.

Whereas the present invention has been described with respect to specific embodiments thereof, it will be understood that various changes and modifications will be suggested to one skilled in the art and it is intended to encompass such changes and modifications as fall within the scope of the appended claims.

We claim:

1. An insulation system for providing temperature control for a pipe having a surface comprising:

a heating element adapted to conform to the surface of a pipe, said heating element having first and second ends and an area substantially in contact with the surface of the pipe when said heating element is positioned adjacent to the pipe;

a first layer of insulating material integrally attached to said heating element, said first layer of insulating material having first and second ends disposed adjacent to one another to form a first seam;

a second layer of insulating material integrally attached to said first layer of insulating material, said second layer of insulating material having first and second ends disposed adjacent to one another to form a second seam;

an exterior layer of insulating material integrally attached to said second layer of insulating material and including a portion to selectively overlap said first and second ends of said second layer of insulating material, said exterior layer of insulating material further including means for selectively locking said second layer of insulating material first and second ends together to prevent opening of said second seam;

means attached to said first layer of insulating material and disposed between and spaced apart from said first and second ends of said heating element and adapted to contact the surface of the pipe for sensing the temperature of the surface of the pipe; and means connected to said temperature sensing means and said heating element for monitoring the temperature of the surface of the pipe and for selectively controlling the temperature of said heating element to thereby maintain the temperature of the surface of the pipe at a desired temperature.

2. The system of claim 1 wherein said locking means includes Velcro loop and hook material disposed on said exterior layer.

3. The system of claim 1 wherein said first seam is circumferentially spaced apart from said second seam.

4. The system of claim 1 wherein said means for monitoring the temperature of the surface of the pipe includes a controller and microprocessor.

5. The system of claim 1 wherein said first and second layers of insulating material each has a thickness, and said thickness of said second layer of insulating material is greater than said thickness of said first layer of insulating material.

* * * * *